United States Patent
Suzuki et al.

(10) Patent No.: US 9,165,482 B2
(45) Date of Patent: Oct. 20, 2015

(54) DISPLAY DEVICE AND METHOD FOR MANUFACTURING THE SAME

(71) Applicant: Panasonic Corporation, Osaka (JP)

(72) Inventors: Takeshi Suzuki, Osaka (JP); Yoshihiro Tomita, Osaka (JP); Koichi Hirano, Osaka (JP); Yasuhiro Arai, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/468,324

(22) Filed: Aug. 25, 2014

(65) Prior Publication Data

US 2015/0069904 A1   Mar. 12, 2015

(30) Foreign Application Priority Data

Sep. 9, 2013   (JP) ................................. 2013-186448

(51) Int. Cl.
    *H01L 51/52* (2006.01)
    *H01L 51/56* (2006.01)
    *H05B 33/02* (2006.01)
    *H05B 33/10* (2006.01)
    *G09F 9/30* (2006.01)
    *H01L 27/32* (2006.01)

(52) U.S. Cl.
    CPC  *G09F 9/30* (2013.01); *H01L 27/32* (2013.01); *H01L 51/5212* (2013.01); *H01L 51/5228* (2013.01)

(58) Field of Classification Search
    CPC ......... H05B 33/06; H05B 33/12; H05B 33/10
    See application file for complete search history.

(56) References Cited

U.S. PATENT DOCUMENTS

| | | | | |
|---|---|---|---|---|
| 5,959,402 A | * | 9/1999 | Polyan | 313/511 |
| 8,223,100 B2 | * | 7/2012 | Su et al. | 345/92 |
| 8,952,998 B2 | * | 2/2015 | Gu et al. | 345/690 |
| 2003/0193056 A1 | | 10/2003 | Takayama et al. | |
| 2006/0152137 A1 | * | 7/2006 | Beteille et al. | 313/503 |
| 2011/0114928 A1 | * | 5/2011 | Suzuki et al. | 257/40 |
| 2012/0138940 A1 | | 6/2012 | Sato | |
| 2012/0153812 A1 | * | 6/2012 | Aurongzeb et al. | 313/504 |
| 2014/0001951 A1 | * | 1/2014 | Hwang et al. | 313/511 |

FOREIGN PATENT DOCUMENTS

| | | |
|---|---|---|
| JP | 2003-108029 | 4/2003 |
| JP | 2004-004663 | 1/2004 |
| JP | 2005-283911 | 10/2005 |
| JP | 2012-119532 | 6/2012 |

\* cited by examiner

*Primary Examiner* — Donald Raleigh
(74) *Attorney, Agent, or Firm* — Wenderoth, Lind & Ponack, L.L.P.

(57) ABSTRACT

A flexible display device includes a wire embedded layer that has flexibility and has a first principal surface, a thick wire embedded in the wire embedded layer so as to be substantially flush with the first principal surface of the wire embedded layer, an extraction lower electrode electrically connected to the thick wire and disposed on the first principal surface of the wire embedded layer, an emitting layer disposed on the extraction lower electrode, and an upper electrode disposed on the emitting layer. The flexible display device is suitable for large-screen devices and offers high productivity.

26 Claims, 10 Drawing Sheets

FIRST PRINCIPAL SURFACE A' OF WIRE EMBEDDED ELEMENT

DISPLAY DEVICE AND METHOD FOR MANUFACTURING THE SAME

BACKGROUND

1. Field

This disclosure relates to a display device and a method for manufacturing the display device. In particular, it relates to a passive-type display device and a method for manufacturing the passive-type display device.

2. Description of the Related Art

In recent years, various types of flat panel displays have been developed. Generally, a flat panel display includes a display medium constituted by elements that use liquid crystals, organic electroluminescence (EL), electrophoresis, or the like.

A display device is manufactured by forming thin-film wires by vacuum process (for example, sputtering) and photolithography on an insulating substrate such as glass and then forming an image displaying unit such as a liquid crystal display (LCD) on the substrate and the thin-film wires.

According to such a method for manufacturing a display device, productivity is not satisfactory if a large-screen display device is to be formed.

SUMMARY

A display device according to this disclosure includes a wire embedded layer that has flexibility and has a first principal surface and a second principal surface; a thick wire embedded in the wire embedded layer so as to be substantially flush with the first principal surface of the wire embedded layer; an extraction lower electrode electrically connected to the thick wire and disposed on the first principal surface of the wire embedded layer; an emitting layer disposed on the extraction lower electrode; and an upper electrode disposed on the emitting layer.

According to this disclosure, a display device that addresses various issues associated with the increase in screen size is provided. In particular, since a thick wire is used, the electrical resistance of wiring is low, and, since the thick wire is embedded in the wire embedded layer, the adverse effects associated with recessed and protruding parts formed by the thick wire are effectively reduced. In other words, this disclosure provides a display device suitable for increasing the screen area.

A method for manufacturing such a display device involves a relatively simple process of pressing a thick wire against a principal surface of a wire embedded element. Thus, a display device suitable for increasing the screen area can be obtained with high productivity.

BRIEF DESCRIPTION OF THE DRAWINGS

FIG. 8B-1, FIG. 8B-2, and FIG. 8B-3 are cross-sectional views each illustrating how the thick wire is embedded in an embedded element;

DESCRIPTION OF THE PREFERRED EMBODIMENTS

Embodiments of this disclosure will now be described with reference to the drawings.

The issues are found to be as follows.

First, voltage reduction caused by wiring resistance becomes increasingly severe as the screen size (area) of display devices increases. Although voltage reduction can be decreased by increasing the thickness of the wire, a long process time will be needed to form thick wires by a vacuum process, resulting in lower productivity.

Second, forming thick wires causes the substrate to have protruding parts and recessed parts. A thick planarizing layer needs to be formed in order to form an OLED or the like on the substrate having protruding and recessed parts and thus the productivity is low.

Third, to address issues related to the protruding and recessed parts on the substrate, a wire structure formed by filling grooves formed in a glass substrate with a metal has been suggested (for example, refer to Japanese Unexamined Patent Application Publication No. 2003-108029) but an expensive, lengthy process, such as reactive ion etching (RIE), is additionally needed to form grooves. Moreover, a vacuum thin film forming process needs to be performed for a long time in order to form wires.

This disclosure addresses the above-described issues by providing a display device that can appropriately address those issues. In particular, an object of the disclosure is to provide a display device that addresses the above-described issues associated with the increasing screen size and a method for manufacturing the display device. In other words, an object is to provide a large-screen display device that can be manufactured with a high productivity.

These issues were addressed in this disclosure through innovative approaches different from those known in the art and a display device that achieves the object is disclosed herein.

Embodiments of such a display device that addresses the aforementioned issues are as follows.

For the sake of simplicity, structural elements having substantially the same function are represented by the same reference symbols in the drawings. The dimensional relationships (length, width, thickness, etc.) in each drawing do not reflect actual dimensional relationships.

Directions referred to in this specification are defined with reference to the positional relationship between a wire embedded layer 10 and an emitting layer 35 of an EL device. For the sake of convenience, the vertical (up-down) direction in the drawing is used to describe directions in the drawing. To be specific, the side on which the emitting layer 35 is positioned with respect to the wire embedded layer 10 is the "upper side" and the side opposite to the upper side is the "lower side".

Figure 1A:
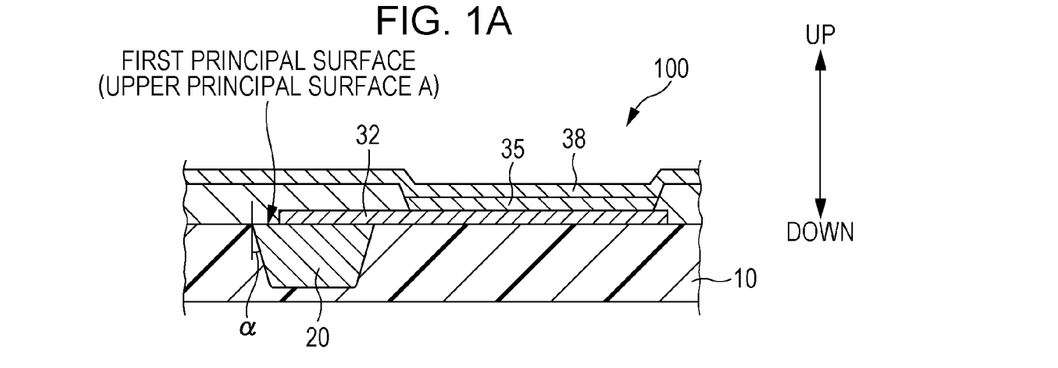
FIG. 1A is a schematic cross-sectional view of a display device according to one embodiment of the disclosure, in which a thick wire and a wire embedded layer are completely flush with each other.
Figure 1B:
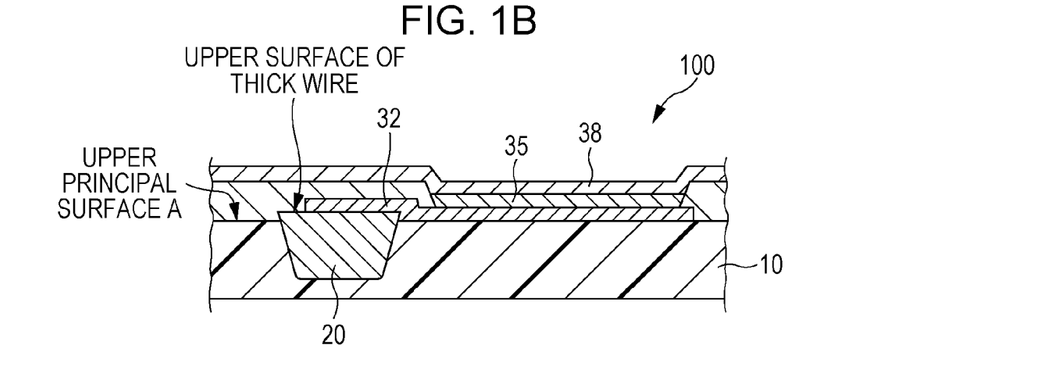
FIG. 1B is a schematic cross-sectional view of a display device according to one embodiment of the disclosure, in which a thick wire slightly protrudes from a wire embedded layer.
Figure 1C:
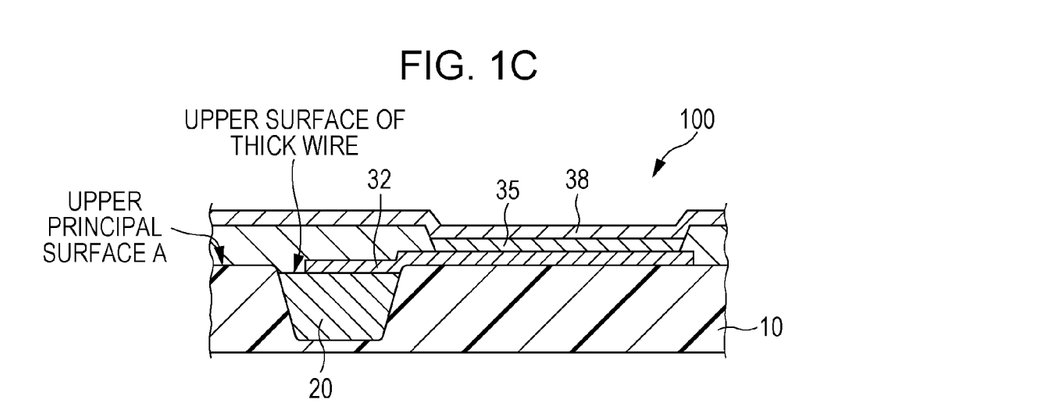
FIG. 1C is a schematic cross-sectional view of a display device according to one embodiment of the disclosure, in which a thick wire is slightly recessed from a wire embedded layer.

Referring now to FIGS. 1A to 1C, a display device 100 according to an embodiment of this disclosure is described. FIGS. 1A to 1C are each a schematic cross-sectional view of a structure of the display device 100.

The display device 100 includes a wire embedded layer 10, a thick wire 20, an extraction lower electrode 32, an emitting layer 35, and an upper electrode 38. The wire embedded layer 10 is a flexible layer and at least has a thick wire embedded therein. The thick wire 20 literally means a wire having a particularly large thickness. The thick wire 20 is embedded so as to be substantially flush with the first principal surface of the wire embedded layer 10. In other words, as illustrated in the drawings, the first principal surface (namely, an upper principal surface A) of the wire embedded layer 10 and an upper surface of the thick wire 20 are substantially flush with each other when viewed as a whole. An EL device (EL device that includes at least a lower electrode, an emitting layer, and an upper electrode) is disposed on the first principal surface (namely, an upper principal surface A flush with the thick wire 20) of the wire embedded layer 10. To be more specific, the extraction lower electrode 32 electrically connected to the thick wire 20 is disposed on the first principal surface of the wire embedded layer 10 (namely, the upper principal surface A), the emitting layer 35 is formed on the extraction lower electrode 32, and the upper electrode 38 is disposed on the emitting layer 35.

In the display device 100, a wire having a large thickness, namely, the thick wire 20, is used. Thus, the electrical resistance of the display device 100 is effectively decreased. Although the thick wire 20 is used, the thick wire 20 is appropriately embedded in the wire embedded layer 10. Thus, the influence of the recessed and protruding parts which would be generated by a "thick wire" is effectively reduced in the display device 100 and the display device 100 is highly planar as a whole. Accordingly, in this disclosure, a display device 100 having low wiring resistance and suitable for a large screen is realized. The thick wire contributes to not only decreasing the resistance but also increasing the mechanical strength; thus, the display device exhibits high reliability against external force such as bending.

Since the wire embedded layer 10 is a flexible layer, the display device 100 is a flexible device, for example. Since the wire embedded layer 10 can be made from a film as described below, a light-weight display device can also be provided.

In the display device 100, the first principal surface (upper principal surface A) of the wire embedded layer 10 is substantially flush with the upper surface of the thick wire 20. This means that when the display device 100 is viewed as a whole, the thick wire 20 embedded in the wire embedded layer 10 is in a state close to being flush with the wire embedded layer 10. In other words, the term "substantially flush" used in this disclosure refers not only to an embodiment in which the first principal surface (upper principal surface A) of the wire embedded layer 10 is completely flush with the upper surface of the thick wire 20 as illustrated in FIG. 1A but also to an embodiment in which the upper surface of the thick wire 20 is positioned to be slightly higher than the first principal surface (upper principal surface A) of the wire embedded layer 10 as illustrated in FIG. 1B and an embodiment in which the upper surface of the thick wire 20 is positioned to be slightly lower than the first principal surface (upper principal surface A) of the wire embedded layer 10 as illustrated in FIG. 1C.

The differences among the respective embodiments illustrated in FIGS. 1A to 1C are as follows.

In FIG. 1A, the upper principal surface A of the wire embedded layer 10 and the upper surface of the thick wire 20 are "completely flush" with each other. In other words, the upper principal surface A of the wire embedded layer 10 and the upper surface of the thick wire 20 are positioned to lie on exactly the same plane. In this case, the planarity of the device as a whole is excellent, which is an advantage.

In FIG. 1B, the upper surface of the thick wire 20 is positioned to be slightly higher than the upper principal surface A of the wire embedded layer 10. In other words, the thick wire 20 is embedded in the wire embedded layer 10 so that the upper surface of the thick wire 20 protrudes from the first principal surface (upper principal surface A) of the wire embedded layer 10. According to this embodiment, planarization is substantially achieved as a whole but because of the slightly protruding part, the electrical connection between the thick wire 20 and the EL device (in particular, the lower electrode of the EL device) is more securely established. Note that it is also possible in this case to achieve complete flushness as in FIG. 1A by providing a barrier layer described below.

In FIG. 1C, the upper surface of the thick wire 20 is positioned to be slightly lower than the upper principal surface A of the wire embedded layer 10. In other words, the thick wire 20 is embedded in the wire embedded layer 10 so that the upper surface of the thick wire 20 is recessed from the first principal surface (upper principal surface A) of the wire embedded layer 10. According to this embodiment, planarization is substantially achieved as a whole, but because of the slightly recessed part, the space allowed for the electrical connection between the thick wire 20 and the EL device (in particular, the lower electrode of the EL device) is larger.

The embodiments illustrated in FIGS. 1B and 1C will now be described in detail. In FIG. 1B, the upper surface of the thick wire 20 slightly protrudes from the upper principal surface A of the wire embedded layer 10. In particular, the upper surface of the thick wire 20 is positioned 0 (exclusive) to about 1 μm higher than the upper principal surface A of the wire embedded layer 10. For example, the upper surface of the thick wire 20 is positioned 0 (exclusive) to about 200 nm higher than the upper principal surface A of the wire embedded layer 10. In FIG. 1C, the upper surface of the thick wire 20 is slightly recessed from the upper principal surface A of the wire embedded layer 10. In particular, the upper surface of the thick wire 20 is positioned 0 (exclusive) to about 1 μm lower than the upper principal surface A of the wire embedded layer 10 in one example and is positioned 0 (exclusive) to about 200 nm lower than the upper principal surface A of the wire embedded layer 10 in another example.

As is understood from the foregoing description, the phrase "embedded to be substantially flush with" or the like expression encompasses those embodiments in which the surfaces are completely flush with each other and in which the difference in level between the surfaces is within ±1 μm in vertical directions. In this disclosure, the embodiments in which the difference in level between the upper surface of the thick wire 20 and the upper principal surface A of the wire embedded layer 10 is within the range of ±1 μm are described as being "embedded to be substantially flush with" each other.

The thick wire 20 used in the display device 100 is preferably composed of a metal having conductivity and a relatively high melting point. Examples of such a metal include copper (Cu, melting point: 1083° C.), nickel (Ni, melting point: 1453° C.), aluminum (Al, melting point: 660° C.), and stainless steel (SUS). For example, the thick wire 20 may be formed of a metal foil. In other words, the thick wire 20 may be prepared by processing a metal foil. Copper foils and aluminum foils, which have low electrical resistance as a wire and are available at low cost, are preferable as the metal foil.

The thickness of the thick wire 20 may be about 100 nm to 100 μm. For example, the thickness of the thick wire 20 is larger than that of the wires typically used in the related art. From this viewpoint, the thick wire 20 has a thickness of 500 nm to 100 μm in one example, a thickness of 1 μm to 70 μm in another example, and 2 μm to 5 μm in yet another example. Since the thick wire 20 described in this disclosure generally has a large thickness, the cross-sectional area (area of a section taken in the thickness direction) is larger than that in the related art.

The width of the thick wire 20 may be about 5 μm to 1 mm. In the case where the thick wire 20 has a tapered shape as described below, the "width" refers to an average value of the minimum width and the maximum width. The thick wire 20 described herein is to have a large thickness and can achieve the desired low resistance despite a small width. In other words, according to this disclosure, the resistance can be decreased while decreasing the width of the thick wire 20. The width of the thick wire 20 may be, for example, 4 μm to 20 μm in one example, 4 μm to 18 μm in another example, and 4 μm to 10 μm in yet another example, although these are merely illustrative examples. According to such wires with finer widths, a relatively large space can be saved for other structural elements of the display device, which is advantageous. Since the wire of this disclosure has a large thickness, undesirable voltage reduction can be avoided and the screen size can be effectively increased even if the width is the same as that of the related art.

The thick wire 20 used in this disclosure is literally a "thick wire". Thus, for example, the proportion of the wire embedded layer 10 occupied by the thick wire 20 is relatively large. In particular, regardless of whether the thick wire 20 protrudes or is recessed, the thick wire 20 occupies at least 50% of the wire embedded layer 10 in the thickness direction in one example, at least 60% of the wire embedded layer 10 in the thickness direction in another example, or at least 70% of the wire embedded layer 10 in the thickness direction in yet another example. The upper limit of this value is not particularly limited and may be, for example, 90%.

In the case where the wire embedded layer 10 has a double layer structure constituted by a flexible film 14 and an adhesive layer 16 as described below (refer to FIG. 2), the thick wire 20 occupies at least 50% of the adhesive layer 16 in the thickness direction, at least 60% of the adhesive layer 16 in the thickness direction in another example, or at least 70% of the of the adhesive layer 16 in the thickness direction in yet another example. The upper limit of this value is also not particularly limited and may be, for example, 90%.

The thick wire 20 is preferably tapered as illustrated in the drawings. The thick wire 20 preferably has a tapered shape at a cross section taken in the device thickness direction. To be more specific, the thick wire 20 described in this disclosure has a tapered shape in which the width gradually decreases from the first principal surface (upper principal surface A) of the wire embedded layer 10 toward the second principal surface of the wire embedded layer 10. According to this tapered shape, the thick wire 20 can be easily embedded in the wire embedded layer 10. Moreover, the degree or extent of embedding can be appropriately adjusted when the thick wire 20 has a tapered shape, which is advantageous. For example, the embodiment in which the upper surface of the thick wire 20 protrudes slightly from the upper principal surface A of the wire embedded layer 10 can be easily obtained by relatively shallowly embedding the thick wire 20 (refer to FIG. 1B). Alternatively, the embodiment in which the upper surface of the thick wire 20 is slightly recessed from the upper principal surface A of the wire embedded layer 10 can be easily obtained by more deeply embedding the thick wire 20 (refer to FIG. 1C). The taper angle α of the thick wire 20 illustrated in FIG. 1A is, for example about 150 to about 700 and about 200 to about 450 in another example, although these values are merely examples.

Figure 2:
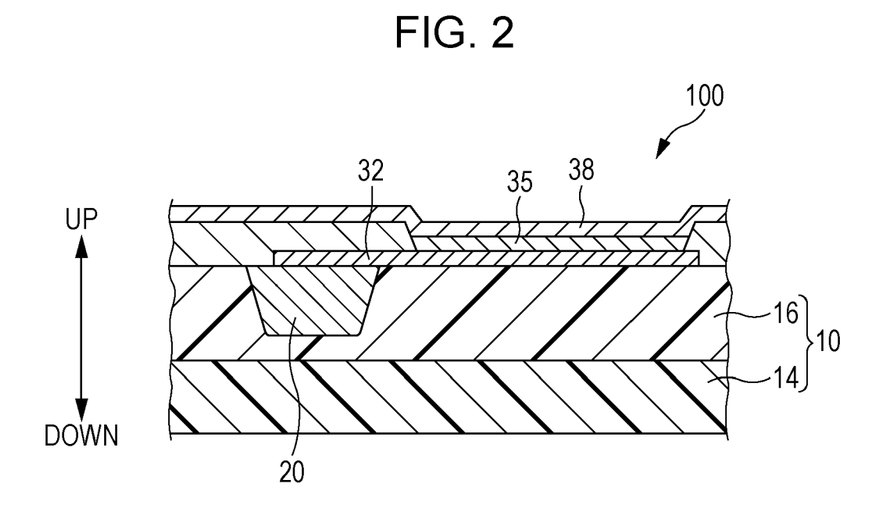
FIG. 2 is a schematic cross-sectional view of a display device according to one embodiment of the disclosure, in which a wire embedded layer has a double layer structure.

The wire embedded layer 10 used in the display device 100 may have a single layer structure and may have a multilayered structure, for example, a double layer structure. In the case where the wire embedded layer 10 has a double layer structure, the wire embedded layer 10 is preferably constituted by a flexible film 14 and an adhesive layer 16 on the flexible film 14, as illustrated in FIG. 2. The adhesive layer 16 fluidizes when pressure is applied during embedding of the thick wire 20 and thus exhibits an appropriately degree of a wire embedding function. The flexible film 14 has no fluidizability but has high thermal stability and mechanical strength. Accordingly, the flexible film 14 can serve as a core material. A wire embedded layer 10 having a double layer structure offers an advantage of widening the range of the choice of the materials used since respective layers can have respective functions.

The flexible film 14 of the wire embedded layer 10 may be, for example, an organic film or an organic/inorganic hybrid film. Examples of the material for the organic film include polyethylene terephthalate (PET), polyethylene naphthalate (PEN), polyimide (PI), and liquid crystal polymers. An example of the material for the organic/inorganic hybrid film is silsesquioxane. In other words, a resin sheet may be used as the flexible film 14. For example, an epoxy sheet, a PPE sheet, or the like may be used. From the viewpoint of incorporating a reinforcing material, a sheet obtained by impregnating a woven fabric or nonwoven fabric of glass fibers or aramid fibers with a resin may be used. The thickness of the flexible film 14 may be, for example, about 1 μm to about 500 μm.

The adhesive layer 16 of the wire embedded layer 10 may be a layer composed of an epoxy-system, polyimide-system, or PPE-system adhesive. The thickness of the adhesive layer 16 may be determined based on the thickness of the thick wire 20 to be embedded. If the adhesive layer 16 is excessively thin, the thick wire 20 cannot be satisfactorily embedded. If the adhesive layer 16 is excessively thick, the adhesive starts to flow and the thick wire 20 cannot be embedded at a desired position. Accordingly, assuming that the thickness of the thick wire 20 is 0.1 µm to 10 µm, the thickness of the adhesive layer 16 is 1 µm to 30 µm, for example.

An EL device used in the display device 100 is disposed on the first principal surface of the wire embedded layer 10, i.e., the upper principal surface A. As illustrated in FIGS. 1A to 1C, the EL device includes at least an extraction lower electrode 32 electrically connected to the thick wire 20, an emitting layer 35, and an upper electrode 38. For example, as illustrated in the drawings, the extraction lower electrode 32 is formed on the upper principal surface A of the wire embedded layer 10, the emitting layer 35 is formed on the extraction lower electrode 32, and the upper electrode 38 is formed on the emitting layer 35, although this is a merely illustrative example. In order to increase the emission efficiency of the EL device, an electron transport layer, a hole transport layer, and the like may be additionally included. In particular, an electron transport layer and a hole transport layer may be disposed to sandwich the emitting layer 35 at the inner side of the extraction lower electrode 32 and the upper electrode 38. Moreover, an electron injection layer, a hole injection layer, or the like may be disposed. The EL device (electroluminescence device) of this disclosure may be an organic EL device that uses an organic substance as a luminescent material (luminescent material used in the emitting layer 35) or may be an inorganic EL device that uses an inorganic substance as a luminescent material (luminescent material used in the emitting layer 35).

The extraction lower electrode 32 of the EL device at least has a function of forming an electric connection to the thick wire 20 and a function of an electrode for the emitting layer 35. The upper electrode 38 at least has a function of an electrode for the emitting layer 35. The material and thickness of the extraction lower electrode 32 and the upper electrode 38 are not particularly limited and may be the same as those of electrodes used in typical EL devices (for example, organic EL devices). For example, the material contained in the extraction lower electrode 32 and the upper electrode 38 may be at least one material selected from the group consisting of indium tin oxide (ITO), indium zinc oxide (InZnO), zinc oxide (ZnO), magnesium, silver, lithium, and aluminum. Since the electrode on the light extraction side (for example, the upper electrode 38) is required to have transparency, the material is preferably an ITO material from such a viewpoint. For example, the thickness of the extraction lower electrode 32 and the upper electrode 38 each may be about 10 nm to 1 µm, about 50 nm to 500 nm in another example, and about 80 nm to 250 nm in yet another example.

The emitting layer 35 of the EL device is a layer that can generate fluorescence and/or phosphorescence. The material and thickness of the emitting layer 35 are not particularly limited as long as fluorescence or phosphorescence can be generated. That is, the emitting layer 35 may be composed of a luminescent material used in a typical EL device. For example, in the case of an organic EL device, examples of the material typically used in the emitting layer 35 include low-molecular fluorescent materials, high-molecular fluorescent materials, and metal complexes. For example, a material with emission efficiency improved by doping a host material with a trace amount of a dopant material may be used. The thickness of the emitting layer 35 is not particularly limited and may be the same as that of a typical EL device. For example, the thickness of the emitting layer 35 may be 5 nm to 500 µm or 10 nm to 100 nm in another example, although this is merely illustrative. The emitting layer 35 need not be a single layer and may have a multilayered structure constituted by two or more layers.

Figure 3A:
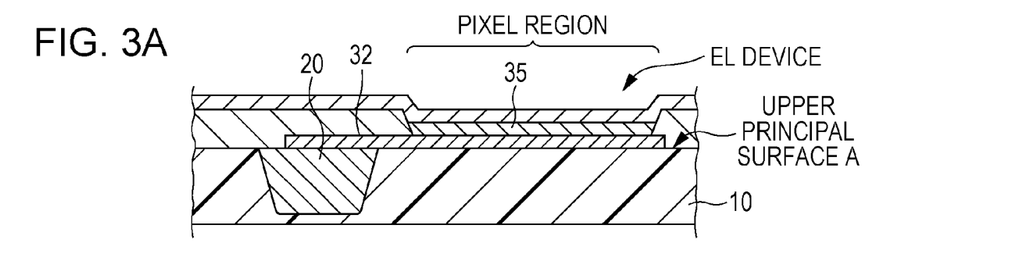
FIGS. 3A and 3B are each a schematic cross-sectional view of a display device according to one embodiment of the disclosure in which a pixel region is defined at a position outside an area above a thick wire.
Figure 3B:
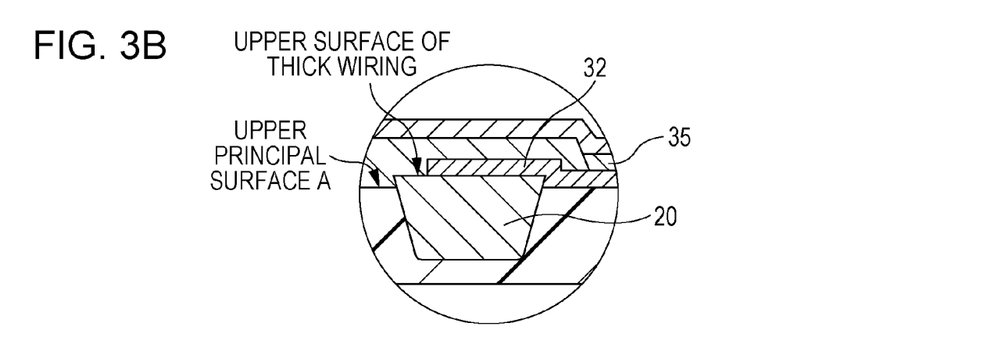
Figure 3C:
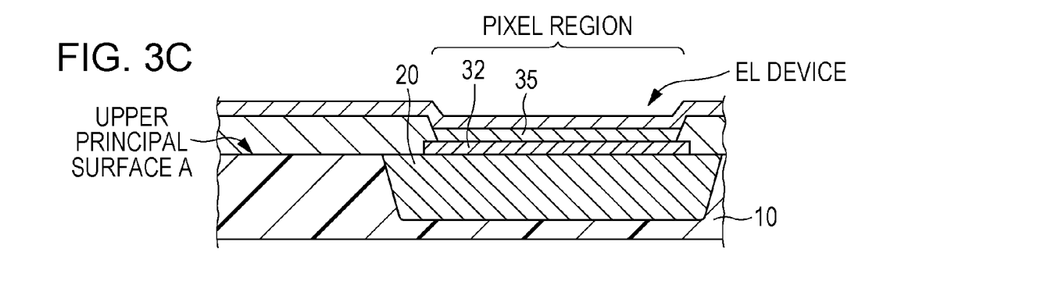
FIGS. 3C and 3D are each a schematic cross-sectional view of a display device according to one embodiment of the disclosure in which a pixel region is defined above a thick wire.

As illustrated in FIGS. 3A and 3C, in the display device 100 of this disclosure, the thick wire 20 and the extraction lower electrode 32 of the EL device are connected to each other. Due to the connection between the thick wire 20 and the extraction lower electrode 32, the thick wire 20 is electrically connected to the EL device. The extraction lower electrode 32 is preferably positioned in at least part of the upper surface of the thick wire 20. In other words, the extraction lower electrode 32 is disposed so as to cover at least part of the upper surface of the thick wire 20 embedded to be flush with the wire embedded layer 10. This corresponds to the embodiment in which an extraction electrode (the extraction lower electrode 32) of an EL device is directly extracted from the upper surface of the thick wire 20. In such an embodiment, the extraction electrode is directly extracted from the upper surface of the thick wire and a display device can be manufactured with a high productivity without additional step and without generating excess contact resistance caused by another extraction electrode or the like.

According to a preferable embodiment of the display device of this disclosure, a pixel area is defined in an area outside the area above a thick wire. As illustrated in FIG. 3A, the EL device on the upper principal surface A of the wire embedded layer 10 is not in the area above a thick wire 20. To be more specific, although the extraction lower electrode 32 is located in the area above the thick wire 20, the emitting portion of the EL device is not located above the thick wire 20. As is illustrated by this embodiment, the "pixel area is defined in the area outside the area above the thick wire 20" or the like expression means that the emitting layer 35 of the EL device is not positioned in the area above the thick wire 20, namely, the emitting layer 35 of the EL device and the thick wire 20 do not overlap each other in the vertical directions in terms of positional relationship. In such an embodiment, the EL device can be satisfactorily distanced from the border between the thick wire and the wire embedded layer. In other words, even in the embodiment in which the thick wire 20 protrudes slightly from the wire embedded layer 10 illustrated in FIG. 3B or FIG. 1B and in the embodiment in which the thick wire 20 is recessed slightly from the wire embedded layer 10 illustrated in FIG. 1C, the influence of the difference in level generated at the border between the thick wire 20 and the wire embedded layer 10 can be satisfactorily avoided, and an EL device can be formed in a planar manner. In particular, the emitting layer 35 of the EL device can be made planar.

Figure 3D:
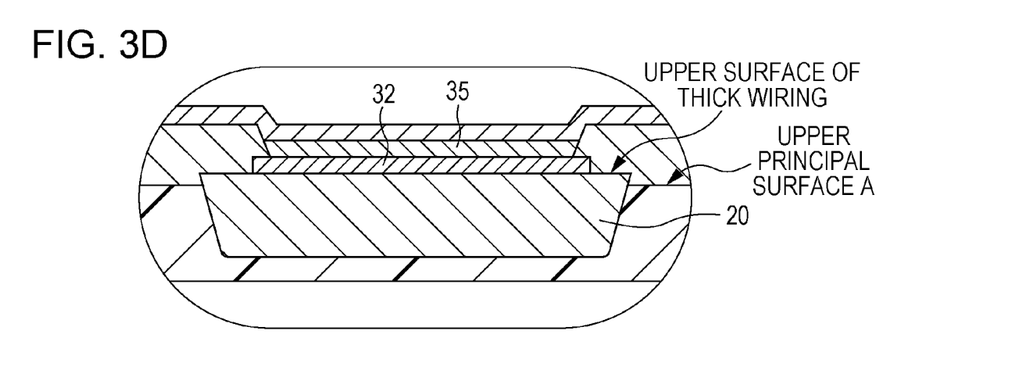

In another preferable embodiment of the display device of this disclosure, a pixel area of the device is defined above the thick wire 20. As illustrated in FIG. 3C, the EL device on the upper principal surface A of the wire embedded layer 10 is disposed in the area above the thick wire 20. To be more specific, not only the extraction lower electrode 32 but also the emitting portion of the EL device is positioned in the area above the thick wire 20. As illustrated in this embodiment, the phrase "the pixel area is defined above the thick wire" means that the emitting layer 35 of the EL device is located in the area above the thick wire 20, in other words, the emitting layer 35 of the EL device and the thick wire 20 overlap each other in the vertical direction in terms of positional relationship. According to this embodiment, the EL device can be appropriately disposed in the area above the thick wire 20. That is, even in the embodiment in which the thick wire 20 slightly protrudes from the wire embedded layer 10 (refer to FIG. 3D) and in the embodiment in which the thick wire 20 is recessed slightly from the wire embedded layer 10, the EL device (in particular, the emitting layer 35) can be formed within the area above the thick wire 20. Thus, the influence of the difference in level generated at the border between the thick wire 20 and the wire embedded layer 10 can be satisfactorily avoided, and an EL device can be formed in a planar manner. In particular, the emitting layer 35 of the EL device can be made planar.

Figure 4:
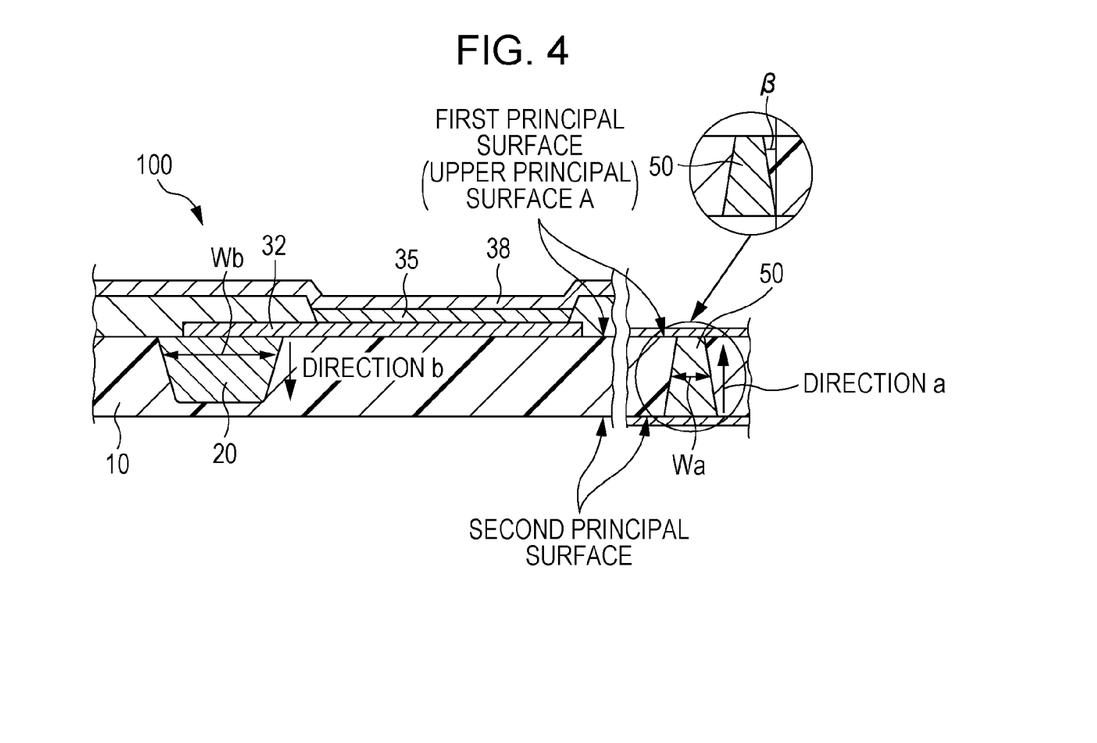
FIG. 4 is a schematic cross-sectional view of a display device according to an embodiment of the disclosure, in which an interlayer connection via is formed.

The display device 100 of this disclosure may include an interlayer connection via. As illustrated in FIG. 4, an interlayer connection via 50 is disposed in the wire embedded layer 10 so as to extend in the thickness direction of the wire embedded layer 10. The interlayer connection via 50 may be connected to, for example, a wiring layer or the like formed on the wire embedded layer 10. The interlayer connection via 50 is preferably disposed so that an electrical signal from the wiring layer can be transmitted to a back surface or the like through a short distance and at a high wiring density. Moreover, when an interlayer connection via is composed of metal, the interlayer connection via can be used to release heat from the emitting layer since the heat resistance of the interlayer connection via is low. As a result, the life of the emitting layer can be extended and the reliability can be improved.

The interlayer connection via 50 preferably has a tapered shape. In other words, the interlayer connection via 50 has a tapered shape at a cross section taken in the device thickness direction. To be more specific, the interlayer connection via 50 according to this disclosure preferably has a tapered shape in which the width gradually increases from the first principal surface (upper principal surface A) of the wire embedded layer 10 toward the second principal surface of the wire embedded layer 10. When an interlayer connection via has a tapered shape, the area occupied by the interlayer connection via at the principal surface side A on which pixels are formed is small and thus high-density wiring is possible. In contrast, since the area of the via is large at the back surface, the alignment accuracy of the relative positions of via lands, and other circuit elements, e.g., wiring, is less severe and the production process can be simplified. The taper angle β of the interlayer connection via 50 shown in FIG. 4 is, for example, about 15° to about 70° and about 20° to about 45° in another example.

In the display device 100 of this disclosure, the interlayer connection via 50 and the thick wire 20 preferably have a reverse taper relationship. In other words, as illustrated in FIG. 4, the width Wa of the interlayer connection via 50 gradually decreases in the direction a while the width Wb of the thick wire 20 gradually decreases in the direction b, and the direction a and the direction b are opposite to each other. This means that the interlayer connection via of this disclosure has a reverse tapered, conical frustum shape in which the cross sectional area on the principal surface side A is smaller than that on the other side. According to the display device 100 having this structure, the tapering effect of the thick wire and the tapering effect of the interlayer connection via can both be exhibited.

Figure 5:
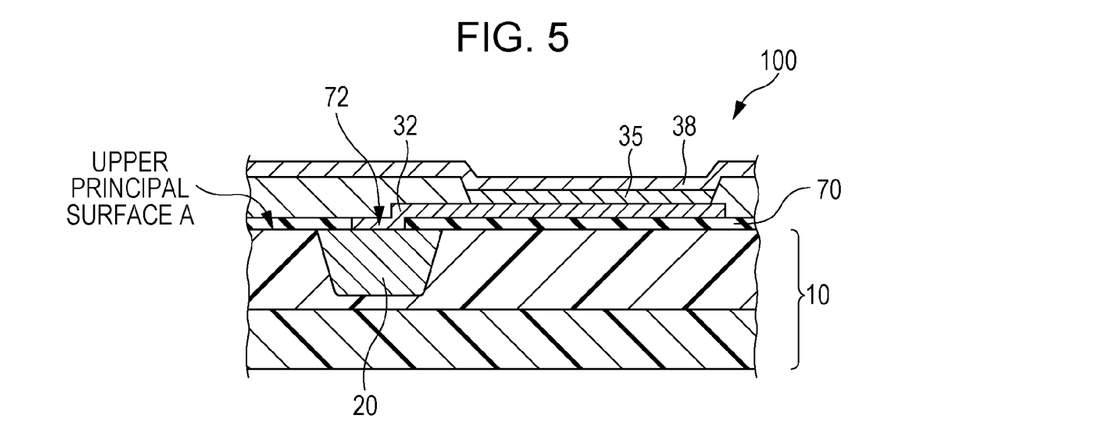
FIG. 5 is a schematic cross-sectional view of a display device according to one embodiment of the disclosure in which a barrier layer is formed.
Figure 6A:
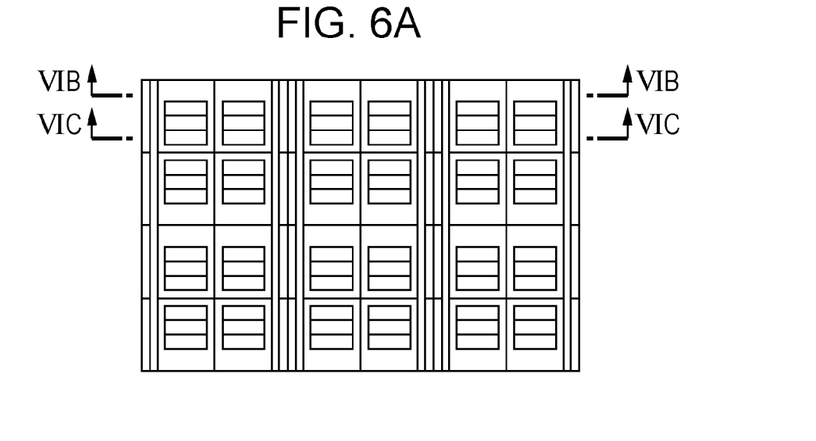
FIG. 6A is a schematic plan view of a structure close to actual embodiment of a display device of this disclosure.
Figure 6B:
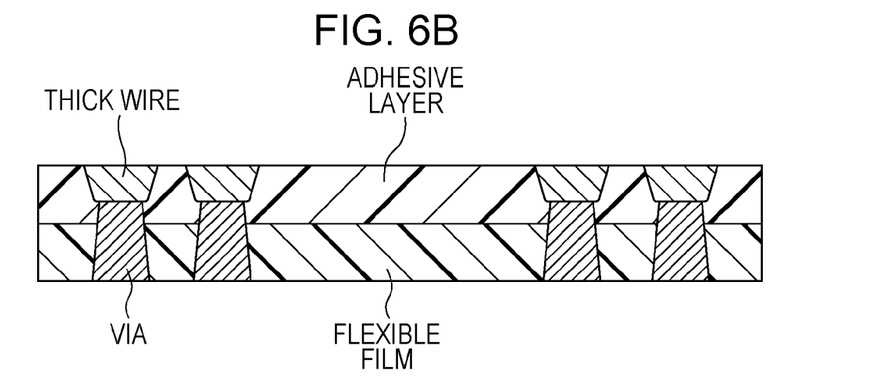
FIGS. 6B and 6C are each a schematic cross-sectional view of the structure shown in FIG. 6A.
Figure 6C:
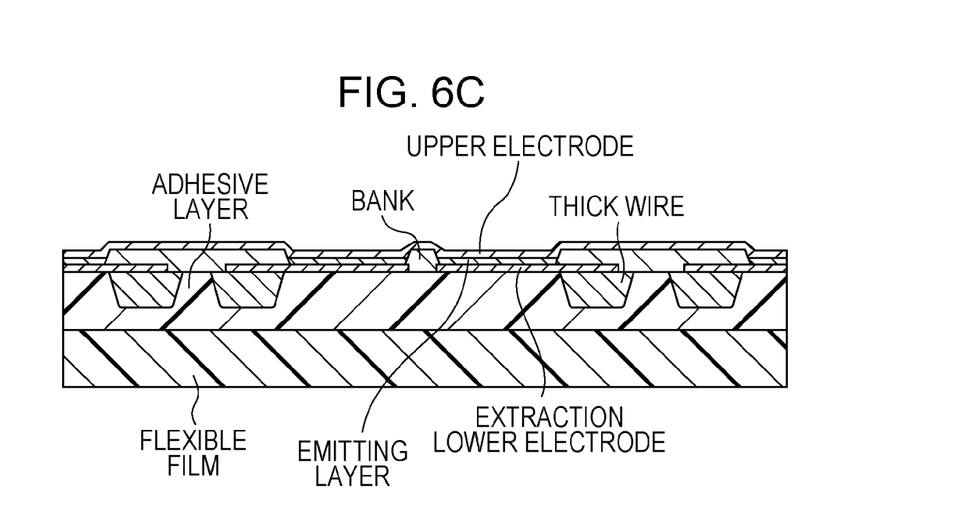
Figure 7A:
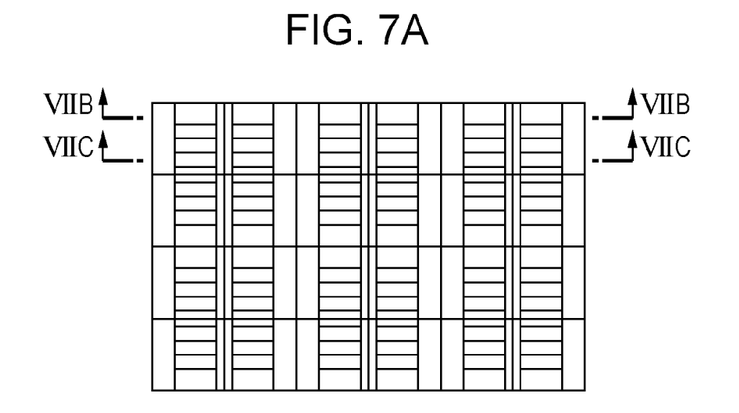
FIG. 7A is a schematic plan view of a structure close to actual embodiment of a display device of this disclosure.
Figure 7B:
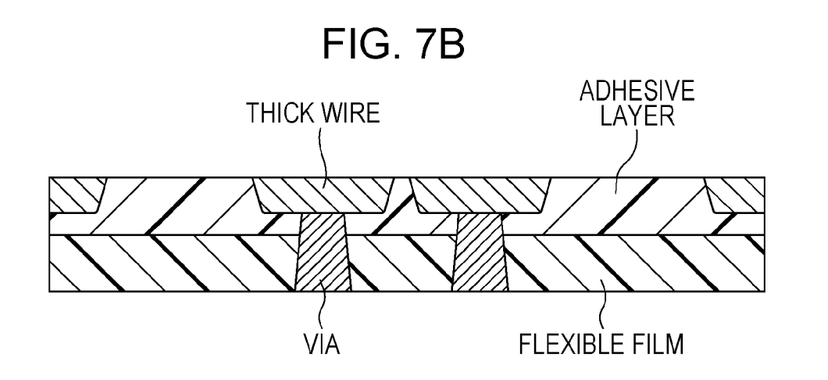
FIGS. 7B and 7C are each a schematic cross-sectional view of the structure shown in FIG. 7A.
Figure 7C:
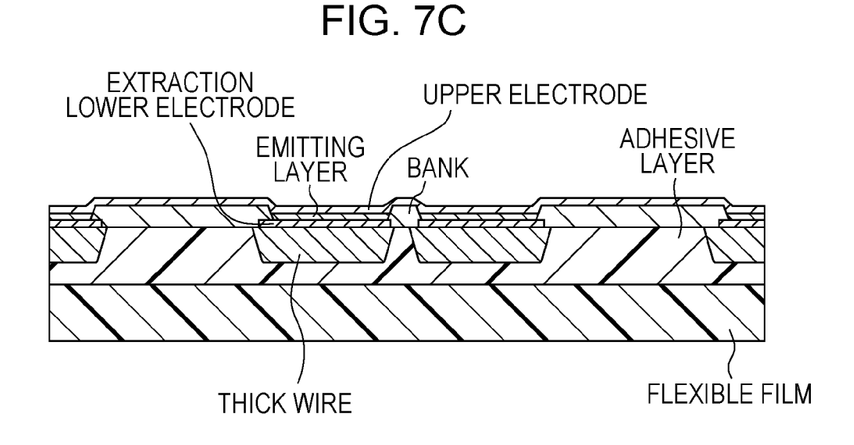

The display device 100 of this disclosure may further include a barrier layer. In particular, as illustrated in FIG. 5, a barrier layer 70 that directly covers the first principal surface (upper principal surface A) of the wire embedded layer 10 may be provided. The barrier layer 70 preferably has an opening 72 in a local area above the thick wire 20 and the thick wire 20 and the extraction lower electrode 32 of the EL device are connected to each other through the opening 72. The barrier layer here substantially means that a layer that blocks passage of moisture, water vapor, and the like. The barrier layer 70 extends the life of the emitting layer susceptible to moisture and water vapor and improves reliability. Because the opening 72 is formed and the connection between the thick wire 20 and the extraction lower electrode 32 is established through the opening 72, the barrier layer 70 also provides an effect of facilitating establishment of the electrical connection in addition to the barrier effect against moisture and water vapor. Note that since the extraction lower electrode 32 composed of metal or an oxide does not allow moisture or water vapor to pass, passage of moisture and water vapor through the opening in the barrier layer can be prevented. The barrier layer 70 may be an inorganic film of $SiO_2$, SiN, or the like or a multilayered film constituted by an inorganic film and a polymer film.

FIGS. 6A to 7C illustrate structures (structures of passive-type OLEDs) close to an actual structure of the display device according to this disclosure. In particular, in the structure illustrated in FIGS. 6A to 6C, an extraction lower electrode is partly positioned in an area above a thick wire but an emitting layer is not positioned in the area above the thick wire and a pixel area is defined in an area outside the area above the thick wire. In the structure illustrated in FIGS. 7A to 7C, not only the extraction lower electrode but also the emitting layer are positioned within the area above the thick wire and the pixel area is defined in the area above the thick wire.

Method for Manufacturing Display Device

Next, a method for manufacturing a display device 100 according to this disclosure is described with reference to FIGS. 8A to 8F. FIGS. 8A to 8F are step cross-sectional views illustrating a method for manufacturing a display device 100.

Figure 8A:
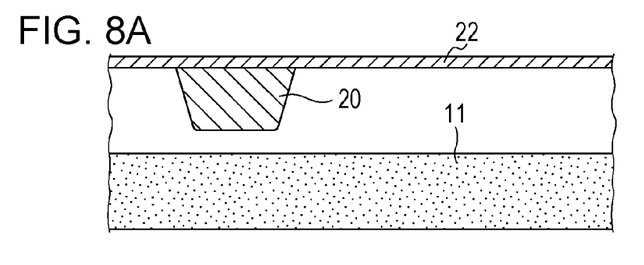
FIGS. 8A to 8F are step cross-sectional views schematically illustrating a method for manufacturing a display device according to this disclosure.
Figure 9A:
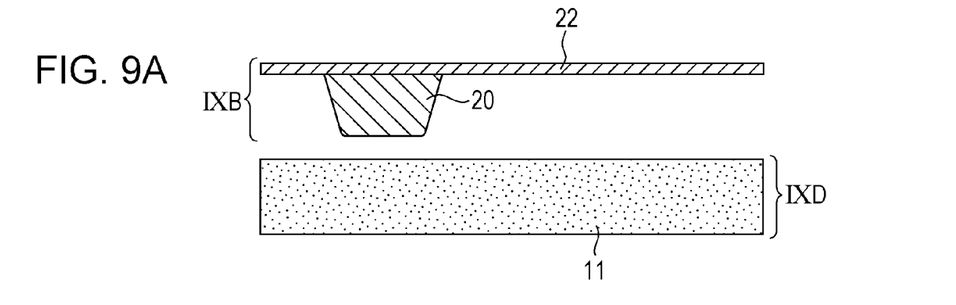
FIGS. 9A to 9D are step cross-sectional views schematically illustrating step (i) of the manufacturing method off this disclosure.

The first step in the manufacturing method of this disclosure is step (i). Referring to FIG. 8A and FIG. 9A, a thick wire 20 and a wire embedded element 11 having flexibility are prepared.

Figure 9B:
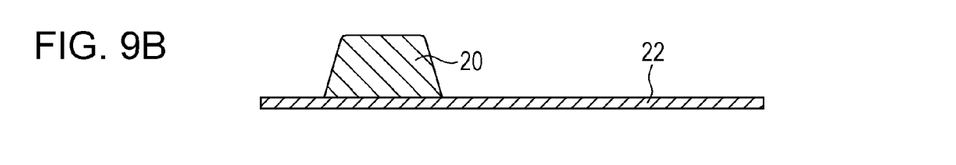

The thick wire 20 can be obtained by processing a metal foil. In this manner, a thick wire having a large thickness, a large cross-sectional area, and low resistance can be obtained with a high productivity compared to when a vacuum process is employed to make such a thick wire. The metal foil is preferably a copper foil or an aluminum foil since the electrical resistance is low as a wire and the cost is less. The thick wire 20 can be prepared as a single element or as a carrier-mounted thick wire in which the thick wire 20 is disposed on a carrier 22 (refer to FIG. 9B). A carrier-mounted thick wire is preferable since it facilitates handling during manufacturing. For example, a carrier-mounted copper film in which a copper foil for forming a wire is formed on a releasing layer on a carrier formed of PET or a copper foil may be used. The carrier 22 is not limited to a flexible substrate such as a plastic film, e.g., a PET film, or a metal foil, e.g., a copper foil, and may be a hard substrate such as a glass substrate. In any case, a thick wire material is formed on a carrier with a releasing layer therebetween if needed.

An example of a carrier-mounted copper foil is one that uses a PET film having a thickness of about 100 μm as the carrier 22 and is formed by laminating a copper foil having a thickness of 2 μm on an organic releasing layer on the carrier 22. The thickness of the copper foil may be determined on the basis of the wiring resistance needed. For example, from the viewpoints of decreasing the voltage reduction and reducing the signal delay, the wiring resistance is preferably as low as possible and thus the thickness is preferably large. However, embedding becomes difficult if the thickness is excessively large. Thus, the thickness of the copper foil in the carrier-mounted copper foil is preferably within the range of 100 nm to 100 μm.

Figure 9C:
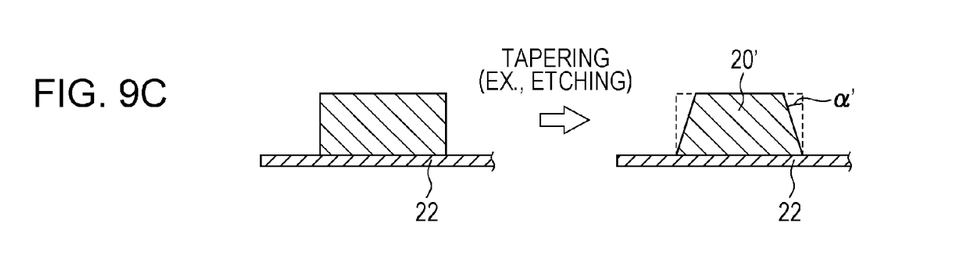

As discussed above, the thick wire 20 can be formed by processing a metal foil. For example, a thick wire is processed to have a tapered shape. That is, a metal foil is processed so that the width is gradually decreased. The taper angle α' illustrated in FIG. 9C is, for example, about 15° to about 70° and about 20° to about 45° in another example. A thick wire of a tapered shape may be formed by etching a metal foil, for example (refer to FIG. 9C). In particular, the metal foil may be partially etched through photolithography or the like so as to form a tapered thick wire 20.

The carrier-mounted thick wire can be obtained by performing photolithography and etching. A typical photolithography/etching process employed in circuit board production can be employed. For example, a desired wiring pattern (for example, a wiring pattern having a tapered cross section) can be obtained by bonding a dry film resist onto a copper foil (copper foil to be used in a carrier-mounted copper foil), laminating a photomask having a desired pattern on the dry film resist, performing exposure and development, and removing unnecessary parts of the copper foil with an iron chloride-hydrochloric acid-based etchant or a sulfuric acid-hydrogen peroxide-based etchant.

The wire embedded element 11 prepared in step (i) is an element that has a flexibility and will have a thick wire 20 embedded therein in the subsequent step (ii). For example, the wire embedded element 11 may be an uncured or semi-cured element and is preferably cured at the same time as or after the embedding of the thick wire 20 by applying heat and/or light.

Figure 9D:
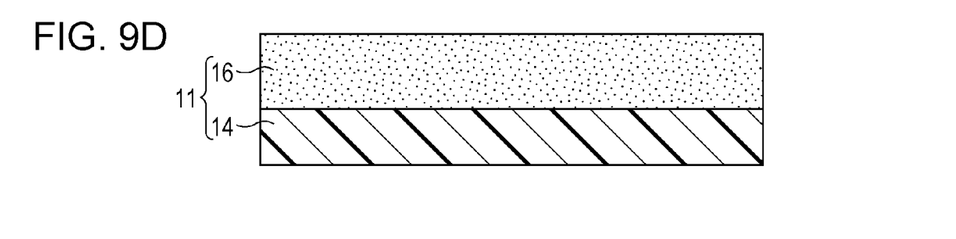

The wire embedded element 11 may have a double layer structure. For example, as illustrated in FIG. 9D, the wire embedded element 11 may be constituted by a flexible film 14 and an adhesive layer 16 (an adhesive layer in an uncured state or a semi-cured state) formed on the flexible film 14. Since the adhesive layer 16 fluidizes when pressure is applied at the time of embedding the thick wire in step (ii), the adhesive layer 16 can exhibit an appropriate wire embedding function. The flexible film 14 has no fluidizability but has high thermal stability and mechanical strength. Thus, the flexible film 14 can serve as a core material. The specific examples of the material and thickness of the flexible film 14 and the adhesive layer 16 are the same as those listed in the description above relating to the display device. For example, the wire embedded element 11 may be a flexible Kapton base material to which a protective film and an adhesive are applied.

Figure 8B:
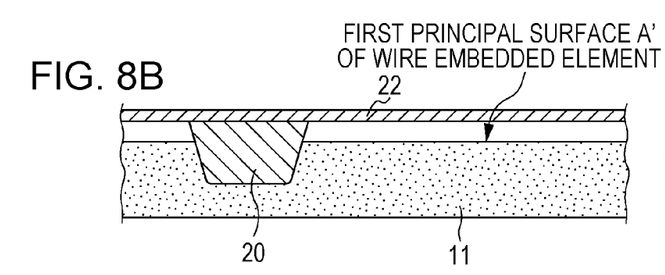

After step (i), step (ii) is performed. As illustrated in FIG. 8B, the thick wire 20 is pressed against a first principal surface A' of the wire embedded element 11 so as to have the thick wire 20 embedded in the wire embedded element 11 and make the principal surface A' of the wire embedded element 11 to be flush with the thick wire 20.

For example, a carrier-mounted copper foil having a desired thick wire pattern shape is laminated on the wire embedded element 11 while having the thick wire pattern to directly oppose the wire embedded element 11, followed by applying heat and pressure by using a hot press, a roll laminator, or the like. As a result, the thick wire 20 can be embedded in the wire embedded element 11. During the process of embedding, the wire embedded element 11 in an uncured or semi-cured state, in particular, the adhesive layer of the wire embedded element 11, can be cured by heat.

The conditions for embedding are determined on the basis of the thickness of the thick wire, the curing temperature and the fluidizability of the wire embedded element, etc. For example, in the case where a thick wire prepared by patterning a Cu foil having a thickness of 5 μm and disposed on a carrier (a PET film having a thickness of 100 μm) is to be embedded in a substrate prepared by applying an epoxy-system adhesive in a semi-cured state serving as a wire embedded element to a polyimide film (Kapton EN) 10 μm in thickness so that the thickness of the applied adhesive was 10 μm, thermal pressing may be performed at a temperature of 160° C. and a pressure of 3 MPa for 30 minutes.

Figure 8B:
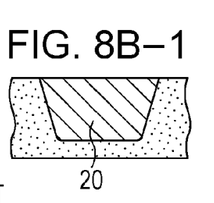
Figure 8B:
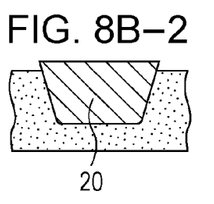
Figure 8B:
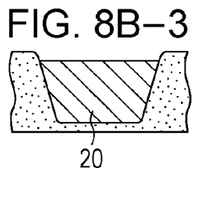
Figure 8C:
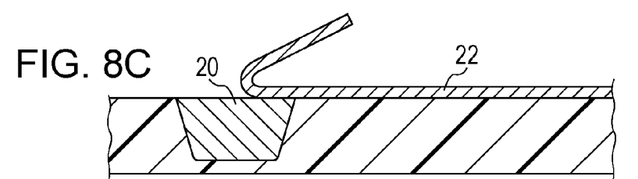

After embedding the thick wire, the carrier 22 is removed, as illustrated in FIG. 8C. The carrier is removed by fixing a part of the carrier and mechanically peeling off the carrier. Since the carrier-mounted copper foil includes a releasing layer, only the carrier can be removed while having the thick wire embedded in the wire embedded element.

In step (ii), the thick wire 20 may be embedded in the wire embedded layer 10 so that the upper principal surface A of the wire embedded layer 10 and the upper surface of the thick wire 20 are completely flush with each other (refer to FIG. 8B-1). Alternatively, the thick wire 20 may be embedded in the wire embedded layer 10 relatively shallowly or deeply. For example, as illustrated in FIG. 8B-2, the thick wire 20 may be embedded shallowly so that the upper surface of the thick wire 20 is positioned to be higher than the principal surface of the wire embedded element 11. In such a case, the thick wire is embedded in the wire embedded layer so that the upper surface of the thick wire protrudes from the first principal surface (upper principal surface A) of the wire embedded layer. In particular, the thick wire 20 may be embedded in the wire embedded element 11 shallowly so that the upper surface of the thick wire 20 is positioned to be 0 (excluding 0) to about 1 μm higher than the upper principal surface of the wire embedded element 11 (or the wire embedded layer obtained therefrom), or, in another example, so that the upper surface of the thick wire 20 is positioned to be 0 (excluding 0) to about 200 nm higher than the upper principal surface of the wire embedded element 11.

Alternatively, as illustrated in FIG. 8B-3, the thick wire 20 may be deeply embedded in the wire embedded element 11 so that the upper surface of the thick wire 20 is positioned to be lower than the principal surface of the wire embedded element 11. In such a case, the thick wire is embedded in the wire embedded element so that the upper surface of the thick wire is recessed from the first principal surface (upper principal surface A) of the wire embedded element. In particular, the thick wire 20 may be deeply embedded in the wire embedded element 11 so that the upper surface of the thick wire 20 is positioned to be 0 (exclusive) to about 1 μm lower than the upper principal surface of the wire embedded element 11 (or the wire embedded layer obtained therefrom) or 0 (exclusive) to about 200 nm lower than the upper principal surface of the wire embedded element 11 in another example.

In the case where a thick wire having a tapered shape in which the width gradually decreases is prepared as the thick wire in step (i), as illustrated in FIG. 8B, the surface of the thick wire 20 having a relatively small width is preferably pressed against the upper principal surface A' of the wire embedded element 11 so as to have the thick wire 20 embedded in the wire embedded element 11 (or the wire embedded layer obtained therefrom). In this case, the thick wire 20 has a tapered shape in which the width gradually decreases from the first principal surface (upper principal surface A) of the wire embedded layer 10 in the resulting display device 100 toward the second principal surface of the wire embedded layer 10. The thick wire 20 can be easily embedded in the wire embedded layer 10 by pressing the surface of the thick wire 20 having a relatively small width against the principal surface A' of the wire embedded element 11. In particular, the extent of embedding can be appropriately adjusted. In other words, it becomes easier to have the thick wire 20 embedded relatively slightly shallowly so that the upper surface of the thick wire 20 slightly protrudes from the upper principal surface of the wire embedded element 11 (or the wire embedded layer obtained therefrom). Alternatively, it becomes easier to have the thick wire 20 embedded relatively slightly deeply so that the upper surface of the thick wire 20 is slightly recessed from the upper principal surface of the wire embedded element 11 (or the wire embedded layer obtained therefrom).

After step (ii), steps (iii) to (v) are performed. In other words, an EL device is formed on the upper principal surface of the wiring embedded element.

Figure 8D:
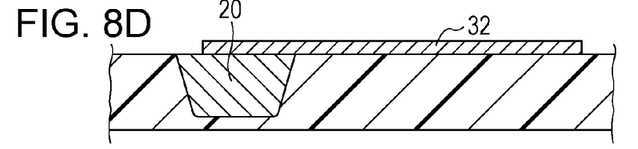

In particular, first, an extraction lower electrode 32 is formed in step (iii). In other words, as illustrated in FIG. 8D, an extraction lower electrode 32 electrically connected to the thick wire 20 is formed on the upper principal surface of the wiring embedded element. The extraction lower electrode 32 can be formed by a thin-film forming method such as vapor deposition or sputtering or a printing method such as screen printing, gravure printing, or ink jet printing. For example, the extraction lower electrode 32 is formed to be located in at least part of the upper surface of the thick wire 20 so as to be connected to the thick wire 20.

Figure 8E:
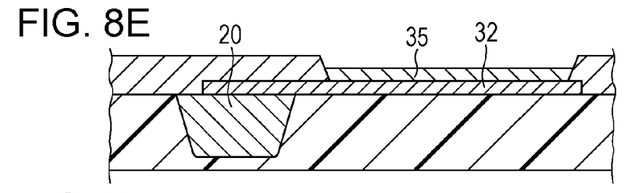

After step (iii), an emitting layer is formed in step (iv). In particular, as illustrated in FIG. 8E, an emitting layer 35 is formed on the extraction lower electrode 32. The method for forming the emitting layer depends on whether the material is based on a high-molecular material or a low-molecular material. Examples of the method include a vacuum vapor deposition method, an ionizing deposition method, a MBE method, and an ink jet method. Typically, when a low-molecular material is used, a dry process such as vacuum vapor deposition can be performed. When a high-molecular material is used, a wet process such as an ink jet method can be performed.

Figure 8F:
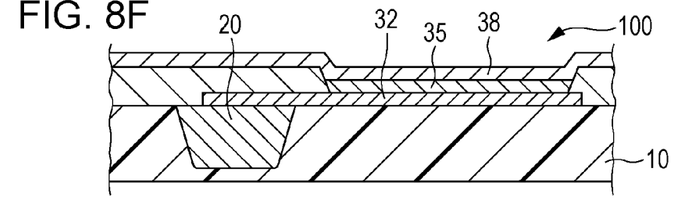

After step (iv), an upper electrode is formed in step (v). In particular, as illustrated in FIG. 8F, an upper electrode 38 is formed on the emitting layer 35. The upper electrode can be formed by a thin film forming method such as vacuum vapor deposition or sputtering or by a printing method such as screen printing, gravure printing, or ink jet printing. In the case where the upper electrode 38 is formed as a transparent electrode composed of an ITO material from the viewpoint of extracting light, sputtering may be employed.

An EL device can be formed through steps (iii) to (v) described above. According to one preferable embodiment, an EL device is formed in an area outside the area above the thick wire 20. In other words, as illustrated in FIGS. 8D to 8F, while the extraction lower electrode 32 of the EL device is formed in the area above the thick wire 20, the emitting portion of the EL device is disposed so as not to overlap the thick wire 20. In particular, the extraction lower electrode 32 is formed so as to partially lie in the area above the thick wire 20 but the emitting layer 35 is formed to lie in an area deviated in a horizontal direction from the area where the thick wire 20 is formed.

According to another preferred embodiment, an EL device is formed in the area above the thick wire 20. In other words, not only the extraction lower electrode 32 of the EL device but also the emitting portion of the EL device is formed in the area above the thick wire 20. In particular, the extraction lower electrode 32 is formed so as to partially lie in the area above the thick wire 20 and the emitting layer 35 is also formed so as to lie in the area above the thick wire 20.

A display device 100 in which a thick wire having a large thickness is embedded in a wire embedded layer having flexibility so that the thick wire is substantially flush with the wire embedded layer can be ultimately obtained through performing steps (i) to (v) above.

Embodiment Including Forming of Interlayer Connection Via

The manufacturing method of this disclosure may further include a step of forming an interlayer connection via. In other words, as illustrated in FIGS. 10A to 10F, the method may further include a step of forming an interlayer connection via 50 in the wire embedded layer such that the interlayer connection via 50 extends in the thickness direction of the wiring embedded element (in particular, the wire embedded layer obtained from the wiring embedded element). As illustrated in the drawings, the step of forming the interlayer connection via 50 can be performed after step (ii) (and before step (iii), for example) in the manufacturing method of this disclosure.

The interlayer connection via 50 can be obtained by forming a blind via after the embedding process of embedding the thick wire 20. In particular, after the process of embedding the thick wire 20 (and after obtaining a wire embedded layer from the wire embedded element 11 by applying heat and/or light), laser irradiation is performed from the other principal surface (principal surface B opposite to the principal surface A in which the thick wire 20 is embedded) of the wire embedded layer to form a blind via (refer to FIG. 10D). Next, the blind via is filled with a conductive material to obtain an interlayer connection via (refer to FIG. 10E). The conductive material filing the blind via may be formed by plating copper or by using an electroconductive paste such as a Ag paste or a Cu paste. The size of the interlayer connection via 50 may be determined on the basis of the electrical resistance and wiring density required. That is, a large via has a low electrical resistance and a large current can be supplied but the number of vias that can be extracted per unit area is small. In contrast, forming small vias is highly difficult. For example, the diameter of the via may be in the range of 5 μm to 300 μm.

The blind via may be formed by photolithography. In such a case, the flexible film is preferably composed of a material that can be photopatterned. For example, a photosensitive epoxy sheet or a photosensitive PPE sheet may be used.

Figure 10A:
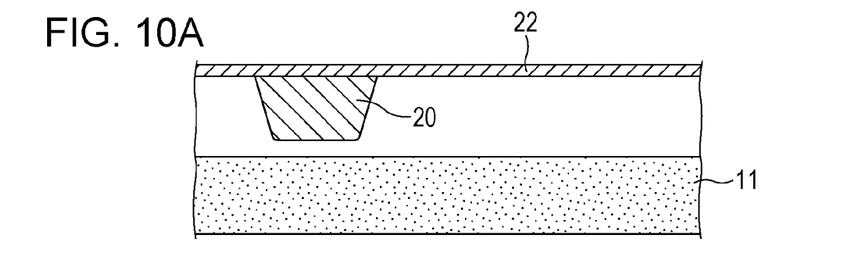
FIGS. 10A to 10F are step cross-sectional views schematically illustrating a method for manufacturing a display device according to this disclosure in which an interlayer connection via is formed.
Figure 10B:
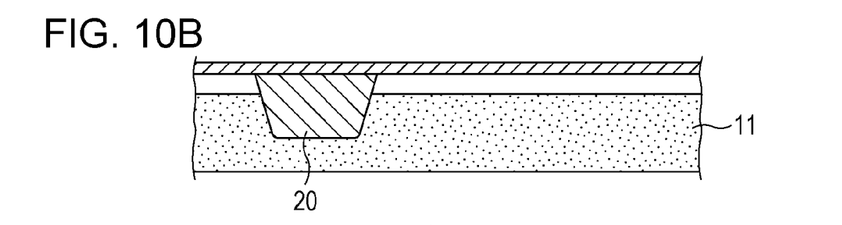
Figure 10C:
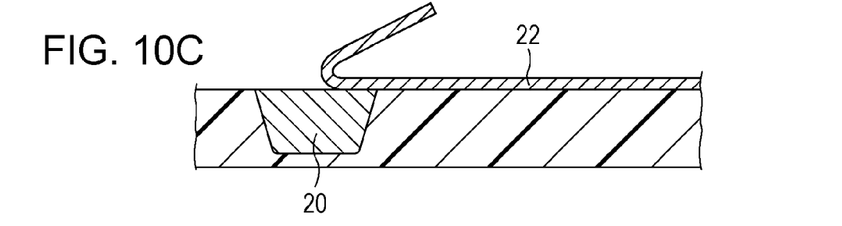
Figure 10D:
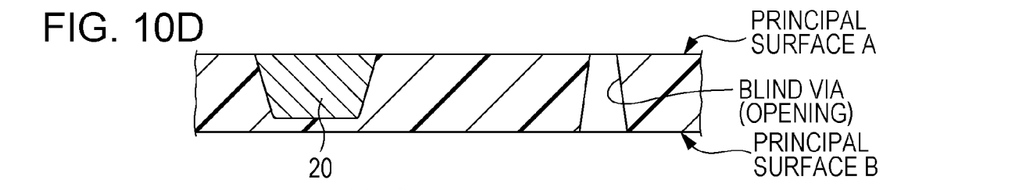
Figure 10E:
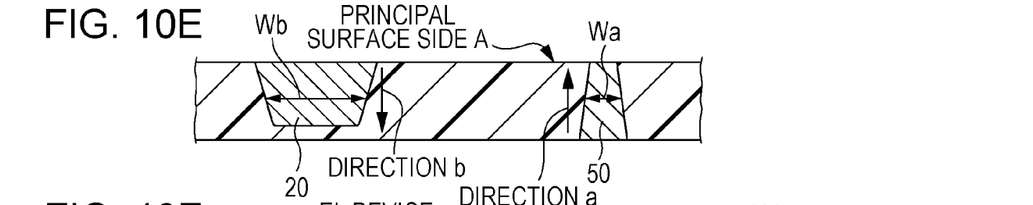
Figure 10F:
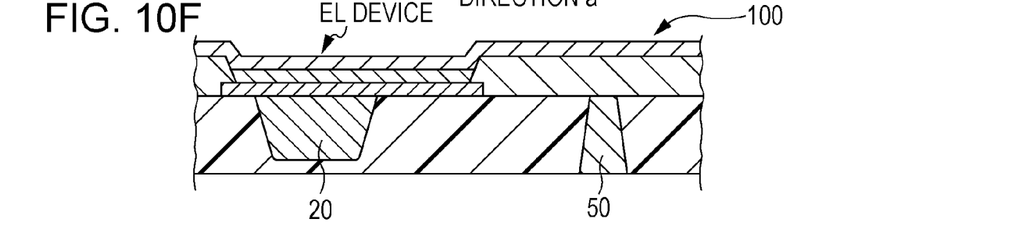
Figure 11A:
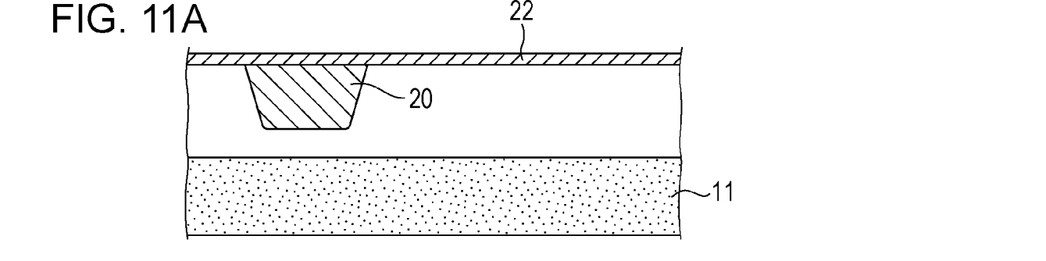
FIGS. 11A to 11F are step cross-sectional views schematically illustrating a method for forming a display device according to this disclosure in which a barrier layer is formed.
Figure 11B:
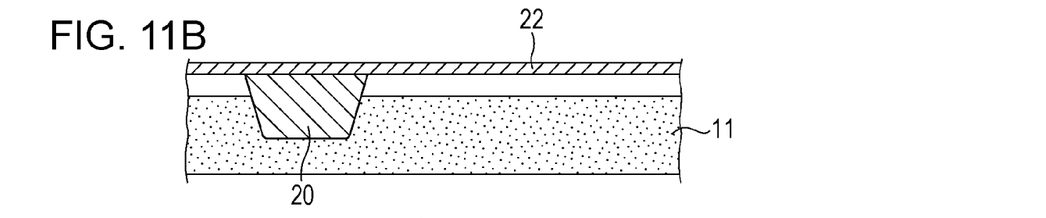
Figure 11C:
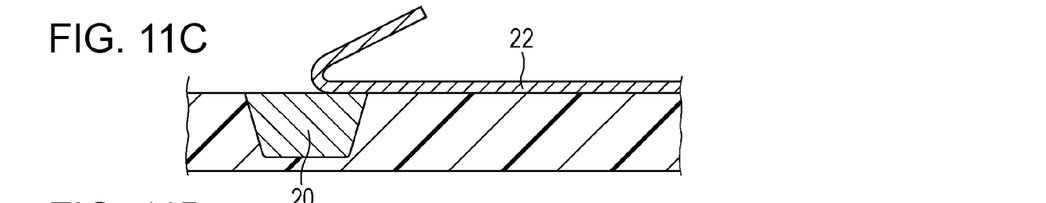
Figure 11D:
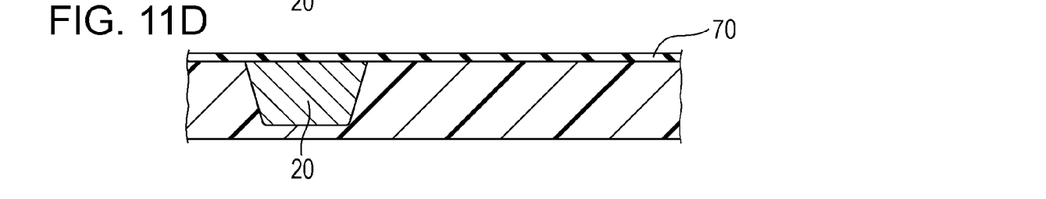
Figure 11E:
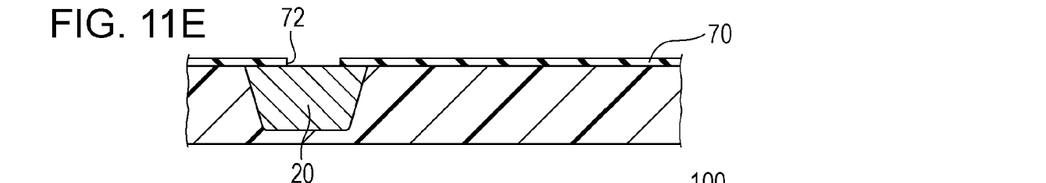
Figure 11F:
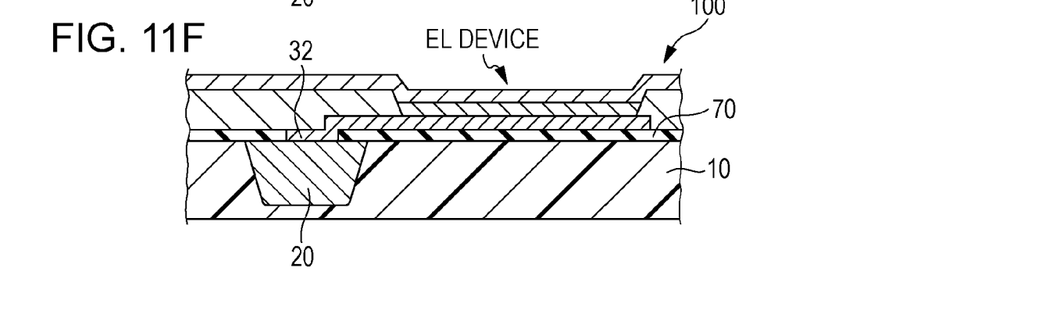

In this disclosure, an interlayer connection via is preferably formed to have a reverse taper relationship with a thick wire so that the direction a in which the width Wa of the interlayer connection via gradually decreases is opposite to the direction b in which the width Wb of the thick wire gradually decreases (refer to FIG. 10E). In other words, the interlayer connection via 50 is preferably formed to have a reverse tapered, conical frustum shape in which the cross-sectional area on the principal surface side A is small. According to the display device 100 having this structure, the tapering effect of the thick wire and the tapering effect of the interlayer connection via can both be exhibited.

Embodiment Including Forming of Barrier Layer

The manufacturing method of this disclosure may further include a step of forming a barrier. That is, as illustrated in FIGS. 11A to 11F, the method may further include a step of forming a barrier layer that directly covers the first principal surface of the wiring embedded element (in particular, the wire embedded layer obtained from the wiring embedded element) (refer to FIG. 11D in particular).

The barrier layer 70 may be an inorganic film composed of $SiO_2$, SiN, or the like, or a multilayered film constituted by an inorganic film and a polymer film in order to exhibit a barrier function of blocking passage of moisture. One example is a layer obtained by laminating two or more pairs of $SiO_2$ (about 100 nm) and siloxane (about 100 nm) formed by CVD. The barrier performance is improved by increasing the number of pairs to be laminated but this increases the cost for forming films. Accordingly, the number of pairs may be determined based on the desired barrier performance and the cost. For example, about two to ten pairs of SiO$_2$ and siloxane may be laminated.

In forming the barrier layer 70, an opening 72 is preferably formed in the area above the thick wire 20 (refer to FIG. 11E) so that the thick wire 20 and the extraction lower electrode 32 of the EL device can be connected to each other through the opening 72. The opening 72 may be formed by irradiating the barrier layer with a laser or by performing photolithography and etching.

The barrier layer can be used to further enhance planarity. For example, in the embodiment in which a thick wire slightly protrudes from the principal surface of the wire embedded layer, further planarization can be achieved by forming a barrier layer on the principal surface of the wire embedded layer so that the barrier layer is completely flush with the topmost surface of the protruding portion.

A display device according to this disclosure includes a wire embedded layer that has flexibility and has a first principal surface and a second principal surface, a thick wire embedded in the wire embedded layer (for example, the thick wire is embedded so as to be substantially flush with the first principal surface of the wire embedded layer), an extraction lower electrode electrically connected to the thick wire and disposed on the first principal surface (the principal surface with which the thick wire is substantially flush) of the wire embedded layer, an emitting layer disposed on the extraction lower electrode, and an upper electrode disposed on the emitting layer.

One of the features of the display device of this disclosure is that a wire having a large thickness is embedded in a wire embedded layer having flexibility. In other words, a wire thicker than those typically used in the related art is embedded in a layer having flexibility. In particular, this thick wire is embedded so as to be substantially flush with the layer having flexibility.

The disclosure also provides a method for manufacturing a display device. The method includes (i) a step of preparing a thick wire and a wire embedded element that has flexibility and has a principal surface; (ii) a step of embedding the thick wire in the wire embedded element by performing an operation of pressing the thick wire against the principal surface of the wire embedded element (for example, the thick wire is embedded in the wire embedded element so as to be substantially flush with the principal surface of the wire embedded element); (iii) a step of forming an extraction lower electrode on the principal surface of the wire embedded element, the extraction lower electrode being electrically connected to the thick wire; (iv) a step of forming an emitting layer on the extraction lower electrode; and (v) a step of forming an upper electrode on the emitting layer.

One of the features of the manufacturing method of this disclosure is that the method includes a process of embedding a wire having a large thickness in a wire embedded element having flexibility. In other words, a step of embedding a wire thicker than those typically used in the related art in an element having flexibility is performed. In particular, the step is performed so as to have the thick wire embedded so as to be substantially flush with the element having flexibility.

The scope of the disclosure is not limited to the aforementioned preferred embodiments and various modifications and alterations are naturally possible as can be easily understood by persons skilled in the art.

The display device according to this disclosure can be used in image display units of various appliances. For example, the display device can be used in an image display unit of a smart phone, an image display unit of a tablet terminal, an image display unit of a television, an image display unit of a cellular phone, an image display unit of a mobile computer or a laptop computer, an image display unit of a digital still camera or a camcorder, or an image display unit of an electronic paper.

What is claimed is:

1. A display device comprising:
    a wire embedded layer that has flexibility and has a first principal surface and a second principal surface;
    a thick wire embedded in the wire embedded layer so as to be substantially flush with the first principal surface of the wire embedded layer;
    an extraction lower electrode electrically connected to the thick wire and disposed on the first principal surface of the wire embedded layer;
    an emitting layer disposed on the extraction lower electrode; and
    an upper electrode disposed on the emitting layer, wherein:
    the wire embedded layer includes a flexible film and an adhesive layer disposed on the flexible film; and
    the thick wire is embedded in the adhesive layer.

2. The display device according to claim 1, wherein the thick wire is embedded in the wire embedded layer such that an upper surface of the thick wire protrudes from the first principal surface of the wire embedded layer.

3. The display device according to claim 1, wherein the thick wire is embedded in the wire embedded layer so that an upper surface of the thick wire is recessed from the first principal surface of the wire embedded layer.

4. The display device according to claim 1, wherein the thick wire has a tapered shape in which a width gradually decreases from the first principal surface toward the second principal surface of the wire embedded layer.

5. The display device according to claim 1, wherein a pixel area is defined at a position outside an area above the thick wire.

6. The display device according to claim 1, wherein a pixel area is defined in an area above the thick wire.

7. The display device according to claim 1, wherein the extraction lower electrode is positioned in at least part of an upper surface of the thick wire.

8. The display device according to claim 1, wherein an interlayer connection via extending in a thickness direction of the wire embedded layer is formed in the wire embedded layer.

9. The display device according to claim 8, wherein the interlayer connection via has a tapered shape in which a width gradually increases from the first principal surface toward the second principal surface of the wire embedded layer.

10. The display device according to claim 9, wherein the thick wire has a tapered shape in which a width gradually decreases from the first principal surface toward the second principal surface of the wire embedded layer, and
    the interlayer connection via and the thick wire are in a reverse taper relationship where the direction in which the width of the interlayer connection via gradually decreases and the direction in which the width of the thick wire gradually decreases are opposite to each other.

11. The display device according to claim 1, wherein the thick wire is formed of a metal foil.

12. The display device according to claim 1, further comprising a barrier layer directly covering the first principal surface of the wire embedded layer,
    wherein an opening is formed in the barrier layer in a local area above the thick wire and the thick wire and the extraction lower electrode are connected to each other through the opening.

13. A method for manufacturing a display device, the method comprising:
(i) a step of preparing a thick wire and a wire embedded element that has flexibility and has a principal surface;
(ii) a step of embedding the thick wire in the wire embedded element by performing an operation of pressing the thick wire against the principal surface of the wire embedded element such that the thick wire is substantially flush with the principal surface of the wire embedded element;
(iii) a step of forming an extraction lower electrode on the principal surface of the wire embedded element, the extraction lower electrode being electrically connected to the thick wire;
(iv) a step of forming an emitting layer on the extraction lower electrode; and
(v) a step of forming an upper electrode on the emitting layer.

14. The method according to claim 13, wherein, in step (ii), the thick wire is embedded in the wire embedded element such that an upper surface of the thick wire is positioned to be higher than the principal surface of the wire embedded element.

15. The method according to claim 13, wherein, in step (ii), the thick wire is embedded in the wire embedded element such that an upper surface of the thick wire is positioned to be lower than the principal surface of the wire embedded element.

16. The method according to claim 13, wherein, in step (i), the thick wire is formed by processing a metal foil.

17. The method according to claim 13, wherein, in step (i), the thick wire is prepared as a carrier-mounted thick wire in which the thick wire is mounted on a carrier.

18. The method according to claim 13, wherein, in step (i), the wire embedded element is prepared to have a double layer structure constituted by a flexible film and an adhesive layer disposed on the flexible film.

19. The method according to claim 13, wherein, in step (i), the thick wire is prepared to have a tapered shape in which a width gradually decreases, and
in step (ii), a surface of the thick wire, the surface having a relatively small width, is pressed against the principal surface of the wiring embedded element so as to have the thick wire embedded in the wire embedded element.

20. The method according to claim 13, further comprising a step of forming an interlayer connection via extending in a thickness direction of the wire embedded element.

21. The method according to claim 20, wherein, in step (i), the thick wire is prepared to have a tapered shape in which a width gradually decreases,
in step (ii), a surface of the thick wire, the surface having a relatively small width, is pressed against the principal surface of the wiring embedded element so as to have the thick wire embedded in the wire embedded element, and
the interlayer connection via is formed to be in a reverse taper relationship with the thick wire, in which a direction in which a width Wa of the interlayer connection via gradually decreases and a direction in which a width Wb of the thick wire gradually decreases are opposite to each other.

22. The method according to claim 13, wherein, in step (iv), the emitting layer is formed in an area outside an area above the thick wire.

23. The method according to claim 13, wherein, in step (iv), the emitting layer is formed in an area positioned above the thick wire.

24. The method according to claim 13, further comprising a step of forming a barrier layer that directly covers the principal surface of the wire embedded element,
wherein an opening is formed in the barrier layer in a local area above the thick wire and the thick wire and the extraction lower electrode are connected to each other through the opening.

25. A display device comprising:
a wire embedded layer that has flexibility and has a first principal surface and a second principal surface;
a thick wire embedded in the wire embedded layer such that an upper surface of the thick wire protrudes from the first principal surface of the wire embedded layer;
an extraction lower electrode electrically connected to the thick wire and disposed on the first principal surface of the wire embedded layer;
an emitting layer disposed on the extraction lower electrode; and
an upper electrode disposed on the emitting layer.

26. A display device comprising:
a wire embedded layer that has flexibility and has a first principal surface and a second principal surface;
a thick wire embedded in the wire embedded layer so that an upper surface of the thick wire is recessed from the first principal surface of the wire embedded layer;
an extraction lower electrode electrically connected to the thick wire and disposed on the first principal surface of the wire embedded layer;
an emitting layer disposed on the extraction lower electrode; and
an upper electrode disposed on the emitting layer.

* * * * *